United States Patent
Owen (10) Patent No.: US 9,729,092 B2
(45) Date of Patent: Aug. 8, 2017

(54) INVERTER FOR AN ELECTRIC MOTOR OR GENERATOR

(71) Applicant: PROTEAN ELECTRIC LIMITED, Surrey (GB)

(72) Inventor: Geoffrey Owen, Farnham (GB)

(73) Assignee: PROTEAN ELECTRIC LIMITED (GB)

( * ) Notice: Subject to any disclaimer, the term of this patent is extended or adjusted under 35 U.S.C. 154(b) by 0 days.

(21) Appl. No.: 14/900,145

(22) PCT Filed: Jun. 6, 2014

(86) PCT No.: PCT/IB2014/062021
§ 371 (c)(1),
(2) Date: Dec. 18, 2015

(87) PCT Pub. No.: WO2014/203112
PCT Pub. Date: Dec. 24, 2014

(65) Prior Publication Data
US 2016/0149525 A1   May 26, 2016

(30) Foreign Application Priority Data
Jun. 19, 2013  (GB) .................................. 1310940.0

(51) Int. Cl.
*H02P 27/04* (2016.01)
*H02P 6/14* (2016.01)
(Continued)

(52) U.S. Cl.
CPC .............. *H02P 6/14* (2013.01); *H02M 7/003* (2013.01); *H02P 27/06* (2013.01);
(Continued)

(58) Field of Classification Search
CPC .......... H02P 27/04; H02P 27/06; H02M 7/537
(Continued)

(56) References Cited

U.S. PATENT DOCUMENTS 5,576,575 A      11/1996  Terasawa
6,943,445 B2 *    9/2005  Shirakawa .......... H01L 23/5383
                                                  257/723
(Continued)

FOREIGN PATENT DOCUMENTS

CN      102882384 A      1/2013
JP      2002373971 A    12/2002
(Continued)

OTHER PUBLICATIONS

European Patent Office, Written Opinion of the International Search Authority, dated Dec. 18, 2015, World Intellectual Property Organization, Rijswijk.
(Continued)

*Primary Examiner* — Antony M Paul
(74) *Attorney, Agent, or Firm* — Valerie M. Davis; The Mason Group Patent Specialists LLC (57) ABSTRACT

An inverter for an electric motor or generator having a first device and a second device mounted on an element. The first device includes a first switch, a first contact arranged to be coupled to a first terminal of a power source, and a second contact. The second device includes a second switch, a third contact arranged to be coupled to a second terminal of a power source, and a fourth contact. The first device and the second device are mounted on the element such that a portion of the first contact of the first device that is arranged to be coupled to the first terminal of a power source and a portion of the third contact of the second device that is arranged to be coupled to second terminal of a power source are located adjacent to each other on a first region of the element and the second contact of the first device and the fourth contact of the second device are arranged to be coupled to a coil winding of the electric motor or generator.

16 Claims, 10 Drawing Sheets

(51) Int. Cl.
*H02M 7/00* (2006.01)
*H02P 27/06* (2006.01)

(52) U.S. Cl.
CPC .............. *H01L 2224/48091* (2013.01); *H01L 2224/48139* (2013.01); *H01L 2224/48227* (2013.01); *H01L 2224/48472* (2013.01); *H01L 2224/49111* (2013.01); *H01L 2924/19107* (2013.01)

(58) Field of Classification Search
USPC ........ 318/800, 801, 140, 158; 363/131, 144, 363/145, 147, 141, 132, 40, 44, 120; 257/724, 723, 685, E23.14, E25.016
See application file for complete search history.

(56) References Cited

U.S. PATENT DOCUMENTS

| | | | |
|---|---|---|---|
| 7,227,259 B2* | 6/2007 | Heilbronner | H01L 24/49 257/685 |
| 8,054,660 B2* | 11/2011 | Welchko | H02M 7/003 363/131 |
| 8,064,234 B2* | 11/2011 | Tokuyama | H01L 23/473 363/132 |
| 2004/0113268 A1* | 6/2004 | Shirakawa | H01L 23/5383 257/724 |
| 2005/0024805 A1 | 2/2005 | Heilbronner et al. | |
| 2012/0007535 A1 | 1/2012 | Jansson et al. | |

FOREIGN PATENT DOCUMENTS

| | | |
|---|---|---|
| JP | 2003023777 A | 1/2003 |
| JP | 2003199363 A | 7/2003 |
| JP | 2013045847 A | 3/2013 |
| WO | 2014203112 A1 | 12/2014 |

OTHER PUBLICATIONS

European Patent Office; International Search Report; dated Dec. 24, 2014; World Intellectual Property Organization; Rijswijk.
Intellectual Property Office; Exam Report Combination—Search & Exam; dated Jul. 31, 2013; South Wales.
Intellectual Property Office; Exam Report—Standard; dated Oct. 30, 2015; Intellectual Property Office; South Wales.
Intellectual Property Office; Search Report-First; dated Jul. 31, 2013; Intellectual Property Office; South Wales.

* cited by examiner

Fig. 1

PRIOR ART

INVERTER FOR AN ELECTRIC MOTOR OR GENERATOR

The present invention relates to an inverter for an electric motor or generator.

Electric motor systems typically include an electric motor and a control unit arranged to control the power of the electric motor. Examples of known types of electric motor include the induction motor, synchronous brushless permanent magnet motor, switched reluctance motor and linear motor. In the commercial arena three phase electric motors are the most common kind of electric motor available.

A three phase electric motor typically includes three coil sets, where each coil set is arranged to generate a magnetic field associated with one of the three phases of an alternating voltage.

To increase the number of magnetic poles formed within an electric motor, each coil set will typically have a number of coil sub-sets that are distributed around the periphery of the electric motor, which are driven to produce a rotating magnetic field.

Figure 1:
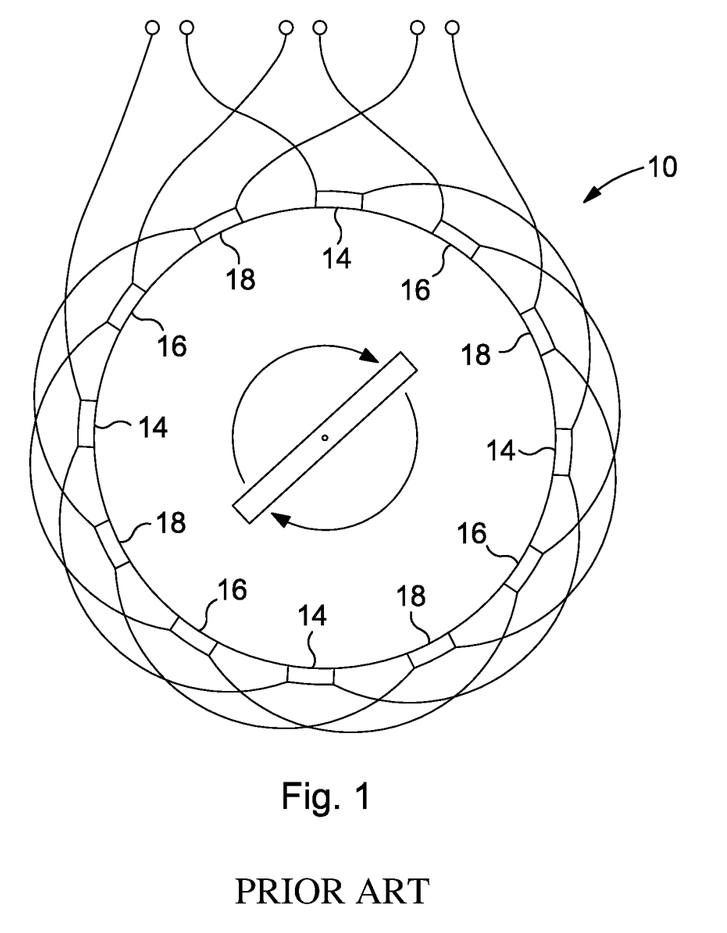
FIG. 1 illustrates a prior art three phase electric motor.

By way of illustration, FIG. 1 shows a typical three phase electric motor 10 having three coil sets 14, 16, 18. Each coil set consists of four coil sub-sets that are connected in series, where for a given coil set the magnetic field generated by the respective coil sub-sets will have a common phase.

The three coil sets of a three phase electric motor are typically configured in either a delta or wye configuration.

A control unit for a three phase electric motor having a DC power supply will typically include a three phase bridge inverter that generates a three phase voltage supply for driving the electric motor. Each of the respective voltage phases is applied to a respective coil set of the electric motor.

A three phase bridge inverter includes a number of switching devices, for example power electronic switches such as Insulated Gate Bipolar Transistor (IGBT) switches, which are used to generate an alternating voltage from a DC voltage supply.

However, the greater the distance the control unit and DC power supply, typically in conjunction with a DC link capacitor, are located from the electric motor the larger the associated current loop will be for the current flow within the electric motor system, where an increase in current loop size will have the effect of increasing the inductance of the electric motor.

As the inductance of the overall electric motor system increases, the greater the voltage transients will be when a variation in current flow occurs, for example upon operation of the inverter switches when generating an alternating voltage supply. The higher the voltage transients are within an electric motor system the greater the power rating for the inverter switches within an electric motor inverter need to be, where higher power rated switches having slower switching speeds and larger switching losses than corresponding smaller switching devices.

In accordance with an aspect of the present invention there is provided an inverter according to the accompanying claims.

The present invention provides the advantage of minimising the current loop area within an inverter. In particular, the current loop area is minimised by configuring the inverter switches so that the coupling of positive and negative power rail lines to a leg of an inverter are located adjacent to each other on one side of a circuit board with the phase winding of the electric motor being coupled to the leg of the inverter on the opposite side of the circuit board.

The present invention will now be described, by way of example, with reference to the accompanying drawings, in which.

The embodiment of the invention described is for an inverter for an electric motor, where the electric motor is for use in a wheel of a vehicle. However the electric motor may be located anywhere within the vehicle. The motor is of the type having a set of coils being part of the stator for attachment to a vehicle, radially surrounded by a rotor carrying a set of magnets for attachment to a wheel. For the avoidance of doubt, the various aspects of the invention are equally applicable to an electric generator having the same arrangement. As such, the definition of electric motor is intended to include electric generator. In addition, some of the aspects of the invention are applicable to an arrangement having the rotor centrally mounted within radially surrounding coils. As would be appreciated by a person skilled in the art, the present invention is applicable for use with other types of electric motors.

Figure 2:
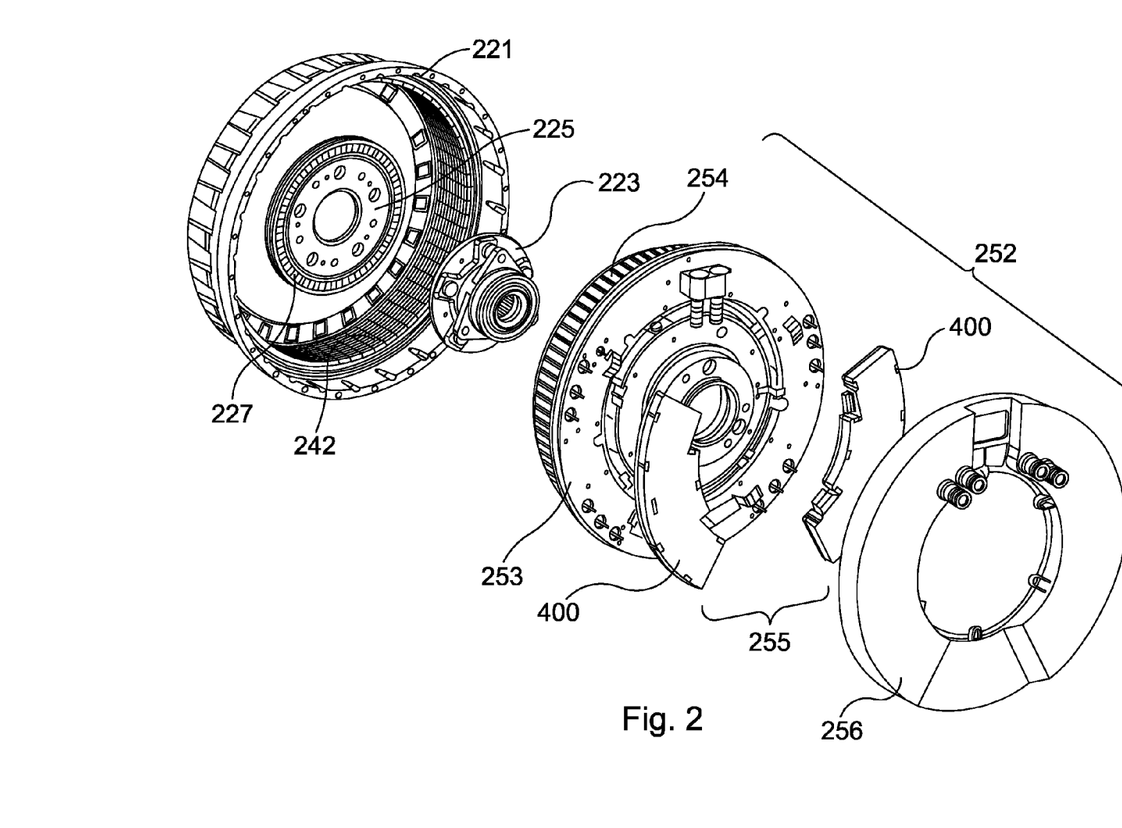
FIG. 2 illustrates an exploded view of a motor embodying the present invention.
Figure 3:
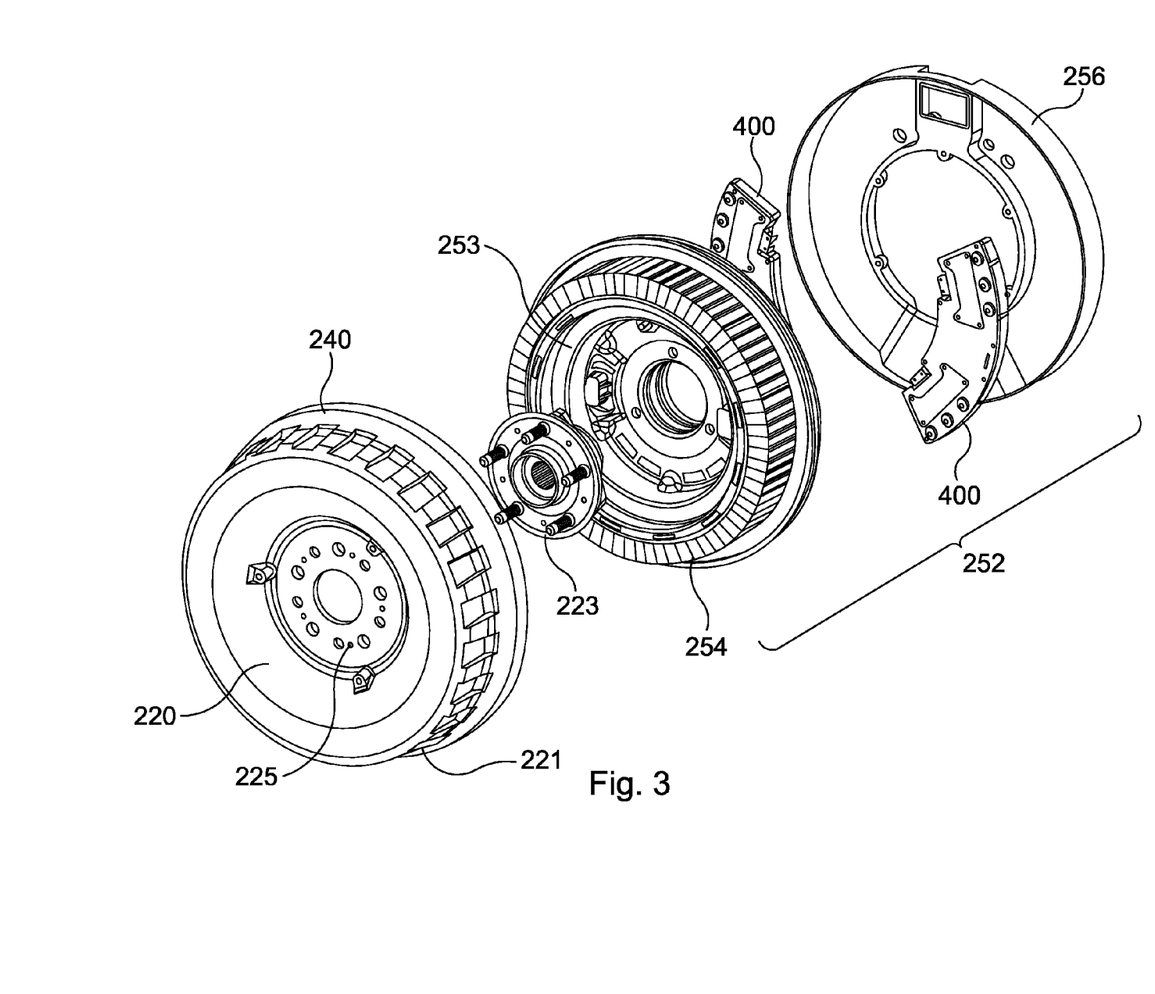
FIG. 3 illustrates an exploded view of the electric motor shown in FIG. 1 from an alternative angle.

For the purposes of the present embodiment, as illustrated in FIG. 2 and FIG. 3, the in-wheel electric motor includes a stator 252 comprising a heat sink 253, multiple coils 254, two control devices 400 mounted on the heat sink 253 on a rear portion of the stator for driving the coils, and an annular capacitor, otherwise known as a DC link capacitor, mounted on the stator within the inner radius of the control devices 400. The coils 254 are formed on stator tooth laminations to form coil windings. A stator cover 256 is mounted on the rear portion of the stator 252, enclosing the control devices 400 to form the stator 252, which may then be fixed to a vehicle and does not rotate relative to the vehicle during use.

Figure 4:
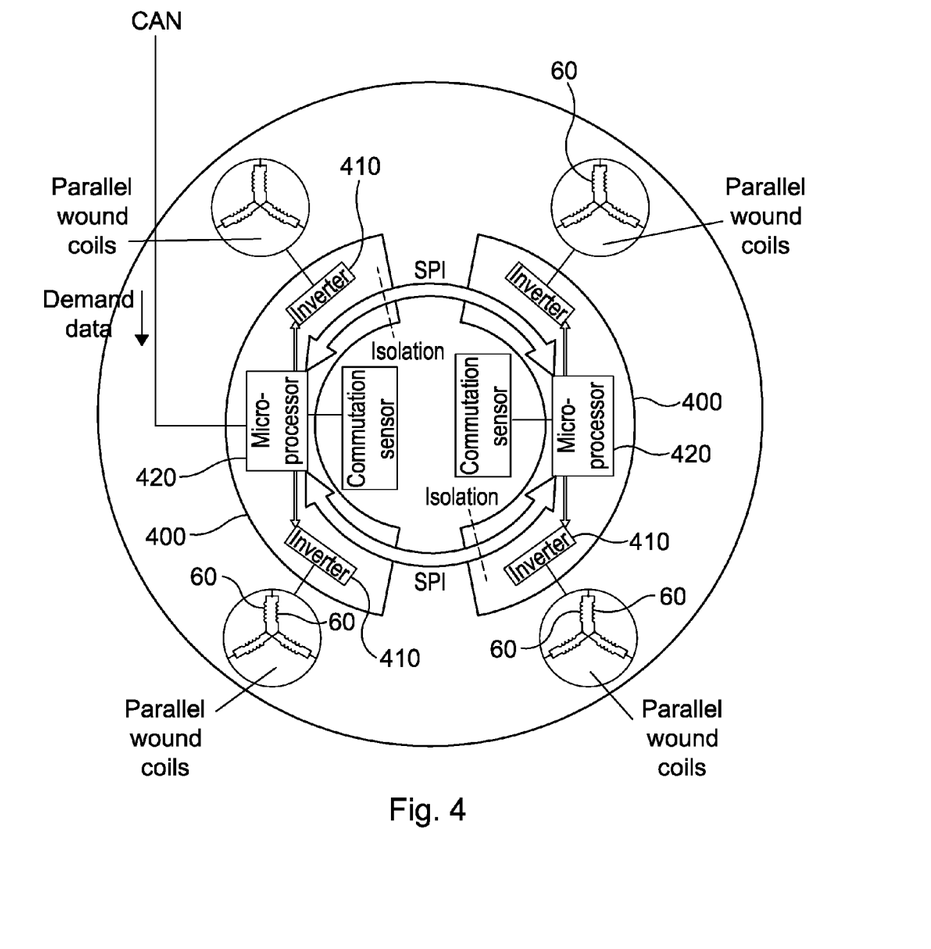
FIG. 4 illustrates an electric motor according to an embodiment of the present invention.

Each control device 400 includes two inverters 410 and control logic 420, which in the present embodiment includes a processor, for controlling the operation of the inverters 410, which is schematically represented in FIG. 4.

The annular capacitor is coupled across the inverters 410 and the electric motor's DC power source for reducing voltage ripple on the electric motor's power supply line, otherwise known as the DC busbar, and for reducing voltage overshoots during operation of the electric motor. For reduced inductance the capacitor is mounted adjacent to the control devices 400.

A rotor 240 comprises a front portion 220 and a cylindrical portion 221 forming a cover, which substantially surrounds the stator 252. The rotor includes a plurality of permanent magnets 242 arranged around the inside of the cylindrical portion 221. For the purposes of the present embodiment 32 magnet pairs are mounted on the inside of the cylindrical portion 221. However, any number of magnet pairs may be used.

The magnets are in close proximity to the coil windings on the stator 252 so that magnetic fields generated by the coils interact with the magnets 242 arranged around the inside of the cylindrical portion 221 of the rotor 240 to cause the rotor 240 to rotate. As the permanent magnets 242 are utilized to generate a drive torque for driving the electric motor, the permanent magnets are typically called drive magnets.

The rotor 240 is attached to the stator 252 by a bearing block 223. The bearing block 223 can be a standard bearing block as would be used in a vehicle to which this motor assembly is to be fitted. The bearing block comprises two parts, a first part fixed to the stator and a second part fixed to the rotor. The bearing block is fixed to a central portion 253 of the wall of the stator 252 and also to a central portion 225 of the housing wall 220 of the rotor 240. The rotor 240 is thus rotationally fixed to the vehicle with which it is to be used via the bearing block 223 at the central portion 225 of the rotor 240. This has an advantage in that a wheel rim and tyre can then be fixed to the rotor 240 at the central portion 225 using the normal wheel bolts to fix the wheel rim to the central portion of the rotor and consequently firmly onto the rotatable side of the bearing block 223. The wheel bolts may be fitted through the central portion 225 of the rotor through into the bearing block itself. With both the rotor 240 and the wheel being mounted to the bearing block 223 there is a one to one correspondence between the angle of rotation of the rotor and the wheel.

FIG. 3 shows an exploded view of the same motor assembly illustrated in FIG. 2 from the opposite side. The rotor 240 comprises the outer rotor wall 220 and circumferential wall 221 within which magnets 242 are circumferentially arranged. As previously described, the stator 252 is connected to the rotor 240 via the bearing block at the central portions of the rotor and stator walls.

A V shaped seal is provided between the circumferential wall 221 of the rotor and the outer edge of the stator.

The rotor also includes a set of magnets 227 for position sensing, otherwise known as commutation magnets, which in conjunction with sensors mounted on the stator allows for a rotor flux angle to be estimated. The rotor flux angle defines the positional relationship of the drive magnets to the coil windings. Alternatively, in place of a set of separate magnets the rotor may include a ring of magnetic material that has multiple poles that act as a set of separate magnets.

To allow the commutation magnets to be used to calculate a rotor flux angle, preferably each drive magnet has an associated commutation magnet, where the rotor flux angle is derived from the flux angle associated with the set of commutation magnets by calibrating the measured commutation magnet flux angle. To simplify the correlation between the commutation magnet flux angle and the rotor flux angle, preferably the set of commutation magnets has the same number of magnets or magnet pole pairs as the set of drive magnet pairs, where the commutation magnets and associated drive magnets are approximately radially aligned with each other. Accordingly, for the purposes of the present embodiment the set of commutation magnets has 32 magnet pairs, where each magnet pair is approximately radially aligned with a respective drive magnet pair.

A sensor, which in this embodiment is a Hall sensor, is mounted on the stator. The sensor is positioned so that as the rotor rotates each of the commutation magnets that form the commutation magnet ring respectively rotates past the sensor.

As the rotor rotates relative to the stator the commutation magnets correspondingly rotate past the sensor with the Hall sensor outputting an AC voltage signal, where the sensor outputs a complete voltage cycle of 360 electrical degrees for each magnet pair that passes the sensor.

For improve position detection, preferably the sensor includes an associated second sensor placed 90 electrical degrees displaced from the first sensor.

In the present embodiment the electric motor includes four coil sets 60 with each coil set 60 having three coil sub-sets 61, 62, 63 that are coupled in a wye configuration to form a three phase sub-motor, resulting in the motor having four three phase sub-motors. The operation of the respective sub-motors is controlled via one of two control devices 400, as described below. However, although the present embodiment describes an electric motor having four coil sets 60 (i.e. four sub motors) the motor may equally have one or more coil sets with associated control devices. In a preferred embodiment the motor 40 includes eight coil sets 60 with each coil set 60 having three coil sub-sets 61, 62, 63 that are coupled in a wye configuration to form a three phase sub-motor, resulting in the motor having eight three phase sub-motors. Similarly, each coil set may have any number of coil sub-sets, thereby allowing each sub-motor to have two or more phases.

FIG. 4 illustrates the connections between the respective coil sets 60 and the control devices 400, where a respective coil set 60 is connected to a respective three phase inverter 410 included on a control device 400. As is well known to a person skilled in the art, a three phase inverter contains six switches, where a three phase alternating voltage may be generated by the controlled operation of the six switches. However, the number of switches will depend upon the number of voltage phases to be applied to the respective sub motors, where the sub motors can be constructed to have any number of phases.

Figure 5:
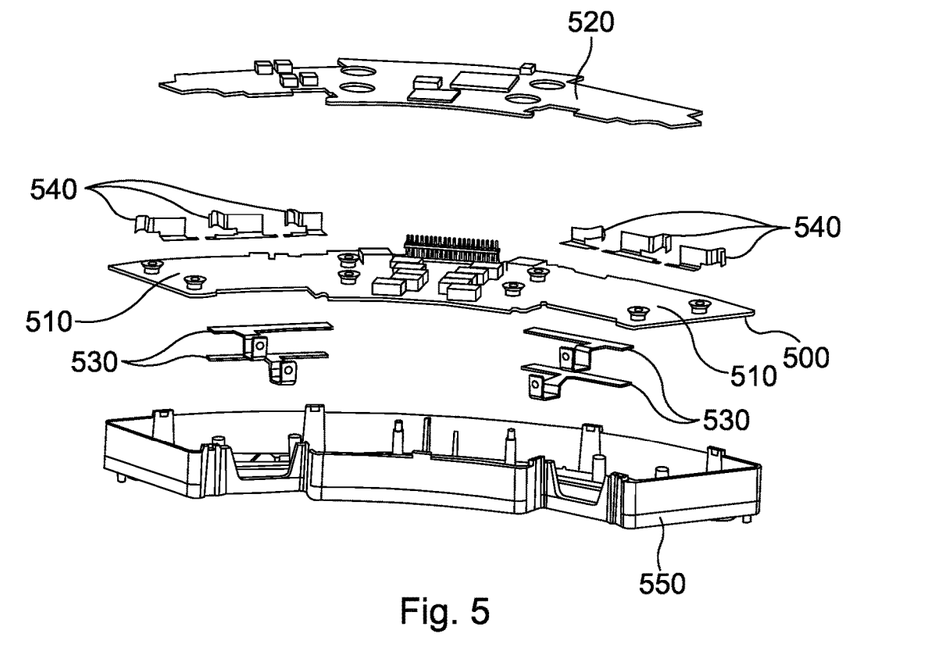
FIG. 5 illustrates a control device for an electric motor according to an embodiment of the present invention.

Preferably, the control devices 400 are of a modular construction. FIG. 5 illustrates an exploded view of a preferred embodiment, where each control device 400, otherwise known as a power module, includes a power printed circuit board 500 in which are mounted two power substrate assemblies 510, a control printed circuit board 520, four power source busbars 530 for connecting to a DC battery, and six phase winding busbars 540 for connecting to respective coil windings. Each of the control device components are mounted within a control device housing 550 with the four power source busbars 530 being mounted on an opposite side of the control device housing 550 to the phase winding busbars 540.

Each power substrate 510 is arranged to be mounted in a respective aperture formed in the power printed circuit board 500.

Figure 6:
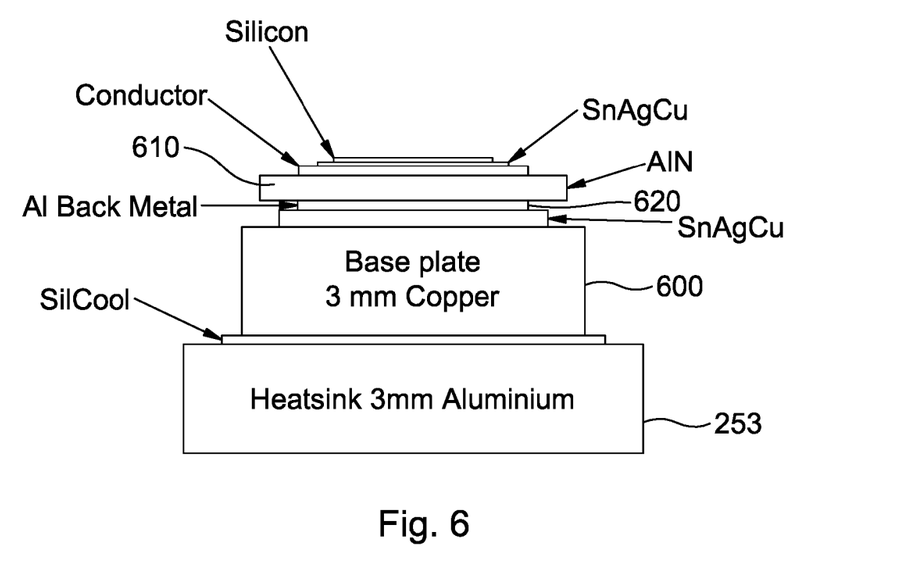
FIG. 6 illustrates a cross sectional view of a power substrate according to an embodiment of the present invention.

A cross section of a preferred power substrate assembly 510 is illustrated in FIG. 6, where each of the power substrates 510 mounted in a control device 400 is an active metal brazed aluminum substrate with a 3 mm copper base plate 600 upon which is formed a three phase inverter 410, where each inverter 410 is coupled to a respective coil set 60. An insulating element 610 with an aluminum backing 620 is soldered to the copper base plate 600 with the elements of an inverter 410 mounted on the insulating element 610, as described below.

The power printed circuit board 500 includes a variety of components that include drivers for the inverter switches formed on the power substrate assemblies 510, where the drivers are typically used to convert control signals into a suitable form to turn the inverter switches on and off.

A first pair of the power source busbars 530 is for providing a current source to an inverter 410 formed on one of the power substrates assemblies 510. A second pair of the power source busbars 530 is for providing a current source to the inverter 410 formed on the other power substrate assembly 510.

For each pair of power source busbars 530, one of the power source busbars 530 is located in a first plane formed above the plane of the power circuit board 500. The other power source busbar 530 is located in a second plane above the first plane. Preferably, each pair of power source busbars 530 are arranged to be substantially co-planar.

The control device housing 550 is arranged so that the bottom of each of the power substrates 510 is placed in direct contact with the stator heat sink when the control device housing 550 is mounted to the stator, thereby allowing for cooling to be applied directly to the base of each of the power substrates 510.

The control printed circuit board 520 is arranged to be mounted in the control device housing 550 above the power printed circuit board 500.

The control printed circuit board 520 includes a processor for controlling the operation of the inverter switches. Additionally, each control printed circuit board 520 includes an interface arrangement to allow communication between the respective control devices 400 via a communication bus with one control device 400 being arranged to communicate with a vehicle controller mounted external to the electric motor. The processor 420 on each control device 400 is arranged to handle communication over the interface arrangement.

The processors 420 on the respective control devices 400 are arranged to control the operation of the inverter switches mounted on the respective power substrates 520 within the control housing 550 to allow each of the electric motor coil sets 60 to be supplied with a three phase voltage supply, thereby allowing the respective coil sub-sets 61, 62, 63 to generate a rotating magnetic field. As stated above, although the present embodiment describes each coil set 60 as having three coil sub-sets 61, 62, 63, the present invention is not limited by this and it would be appreciated that each coil set 60 may have one or more coil sub-sets.

Under the control of the respective processors 420, each three phase bridge inverter 410 is arranged to provide PWM voltage control across the respective coil sub-sets 61, 62, 63, thereby generating a current flow in the respective coil sub-sets for providing a required torque by the respective sub-motors.

PWM control works by using the motor inductance to average out an applied pulse voltage to drive the required current into the motor coils. Using PWM control an applied voltage is switched across the motor windings. During the period when voltage is switched across the motor coils, the current rises in the motor coils at a rate dictated by their inductance and the applied voltage. The PWM voltage control is switched off before the current has increased beyond a required value, thereby allowing precise control of the current to be achieved.

For a given coil set 60 the three phase bridge inverter 410 switches are arranged to apply a single voltage phase across each of the coil sub-sets 61, 62, 63.

Using PWM switching, the plurality of switches are arranged to apply an alternating voltage across the respective coil sub-sets. The voltage envelope and phase angle of the electrical signals is determined by the modulating voltage pulses.

The inverter switches can include semiconductor devices such as MOSFETs or IGBTs. In the present example, the switches comprise IGBTs. However, any suitable known switching circuit can be employed for controlling the current. One well known example of such a switching circuit is the three phase bridge circuit having six switches configured to drive a three phase electric motor. The six switches are configured as three parallel sets of two switches, where each pair of switches is placed in series and form a leg of the three phase bridge circuit. A single phase inverter will have two pairs of switches arranged in series to form two legs of an inverter.

Figure 7:
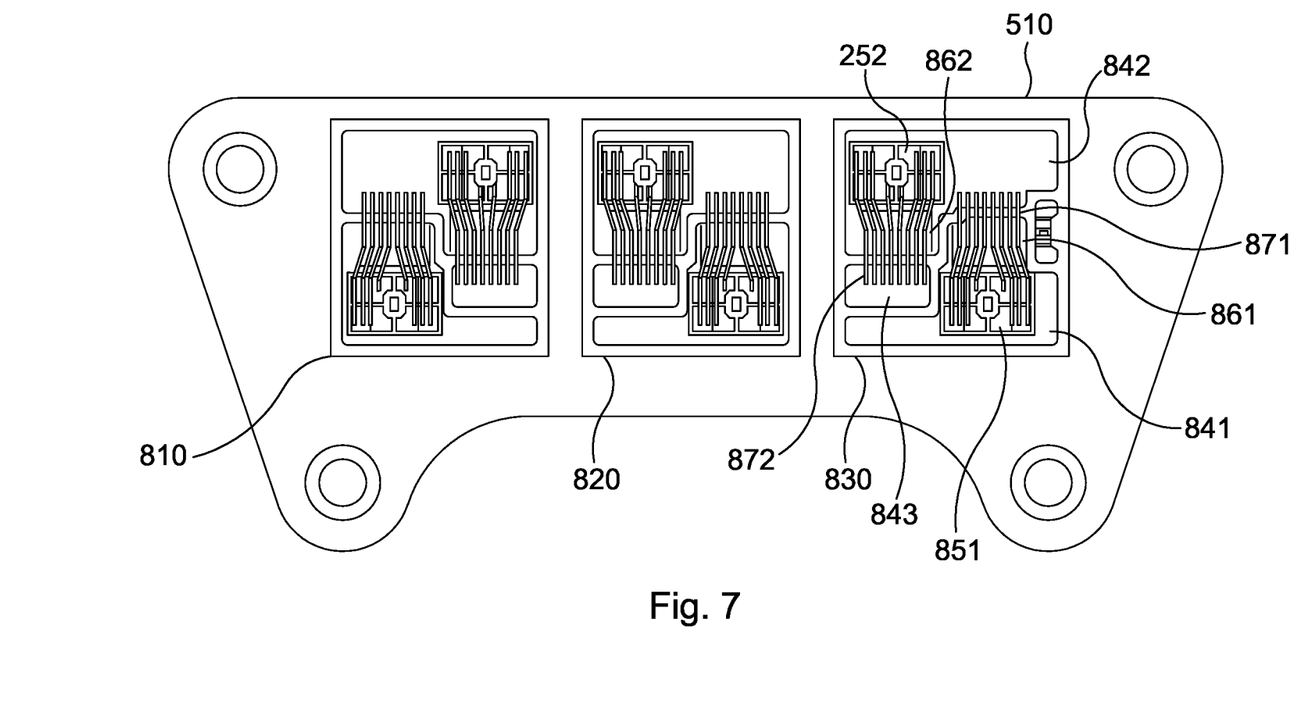
FIG. 7 illustrate an inverter according to an embodiment of the present invention.

FIG. 7 illustrates the inverter switch layout on a power substrate 510 corresponding to a three phase inverter, where three inverter legs 810, 820, 830 are formed on the power substrate 510. The components for each of the inverter legs 810, 820, 830 are mounted on a respective insulating element 610 that has been soldered on to the copper base plate of a power substrate, where each insulating element is approximately 22.1 mm by 22.1 mm.

Each inverter leg 810, 820, 830 has a first conductive region 841, a second conductive region 842 and a third conductive region 843 formed on a respective insulation element 610.

The first conductive region 841 extends laterally along one edge of the insulation element 610 for approximately 20.1 mm with a first semiconductor switch 851 being mounted on one side of the laterally extending region. The portion of the first conductive region 841 upon which the first semiconductor switch 851 is mounted is arranged to extend to approximately the middle of the insulation element 610 with a first diode 861 being mounted adjacent to the first semiconductor switch 851 on the extended portion.

In a first mode of operation the first semiconductor switch 851 is arranged to electrically couple the surface of the switch 851 in contact with the first conductive region 841 with the opposite facing surface of the first semiconductor switch 851. In a second mode of operation the first semiconductor switch 851 is arranged to electrically isolate the surface of the switch 851 in contact with the first conductive region 841 with the opposite facing surface of the first semiconductor switch 851.

The second conductive region 842 extends laterally along an opposite facing edge of the insulation element 610 to that upon which the first conductive region 841 is formed for approximately 20.1 mm. A second semiconductor switch is mounted on one side of the laterally extending region. The portion of the second conductive region 842 upon which the second semiconductor switch 852 is mounted is arranged to extend to approximately the middle of the insulation element 610 with a second diode 862 being mounted adjacent to the second semiconductor switch 852 on the extended portion.

The first semiconductor switch 851 and second semiconductor switch 852 are positioned diagonally with respect to each other relative to their position on the insulation element 610. Although not in contact, the extended portion of the first conductive region 841 is arranged to extend past the extended portion of the second conductive region 842, thereby resulting in the extended portion of the first conductive region 841 overlapping with the extended portion of the second conductive region 842.

In a first mode of operation the second semiconductor switch 852 is arranged to electrically couple the surface of the switch 852 in contact with the second conductive region 842 with the opposite facing surface of the second semiconductor switch 852. In a second mode of operation the second semiconductor switch 852 is arranged to electrically isolate the surface of the switch 852 in contact with the second conductive region 842 with the opposite facing surface of the second semiconductor switch 852.

The third conductive region 843 is positioned between the portion of the second conductive region 842 upon which the second semiconductor switch 852 and the second diode 862 are mounted and the laterally extending region of the first conductive region 841 upon which the first semiconductor switch 851 is not formed, thereby resulting in the third conductive region 843 being formed adjacent to the first conductive region 841, the first semiconductor switch 851, the second conductive region 842 and the second diode 862.

A first conductive element 871 is coupled to the top of the first semiconductor switch 851, to the top of the first diode 862, and on to the laterally extending portion of the second conductive region 842. That is to say, the region of the second conductive region 842 that the second semiconductor switch 852 is not mounted.

A second conductive element 872 is coupled to the top of the second semiconductor switch 852, to the top of the second diode 862, and on to the third conductive region 843.

For the purpose of the present embodiment the first conductive element 871 and the second conductive element 872 are wire bonds, where preferably the first conductive element 871 and the second conductive element 872 both include six wire bonds. Preferably, the first conductive element 871 and second conductive element 872 are mounted so that they are substantially parallel with respect to each other.

The electrical coupling of the first semiconductor switch 851 and the first diode 861 with the first conductive region 841 and the first conductive element 871 results in the first semiconductor switch 851 and first diode 861 being coupled in parallel, with the polarity of the first diode 861 and first semiconductor switch 851 being reversed with respect to each other so that the electrical coupling of the first semiconductor switch 851 and first diode 861 is anti-parallel.

The electrical coupling of the second semiconductor switch 852 and the second diode 862 with the second conductive region 842 and the second conductive element 872 results in the second semiconductor switch 852 and second diode 862 being coupled in parallel, with the polarity of the second diode 862 and second semiconductor switch 852 being reversed with respect to each other so that the electrical coupling of the second semiconductor switch 852 and second diode 862 is anti-parallel.

Each of the power substrates 510, and correspondingly the inverter legs 810, 820, 830, are oriented in the control device housing 550 so that for each inverter leg 810, 820, 830 the side of the insulation element 610 upon which the first semiconductor switch 851 is mounted is located adjacent to a pair of power source busbars 530 and the side of the insulation element 610 upon which the second semiconductor switch 852 is mounted is located adjacent to a phase winding, wherein the power source busbars 530 and phase winding busbars 540 are located on opposite sides of the control device housing 550.

For each of the inverter legs the first conductive region is electrically coupled to one of a pair of power source busbars with the third conductive region being electrically coupled to the other one of the pair of power source busbars. Similarly, the second conductive region is electrically coupled to a phase winding busbar. Preferably, the power connections to the DC power supply and DC link capacitor are welded to the power source busbars 530, with the phase winding busbars 540 being welded to the phase windings of the electric motor.

Figure 8:
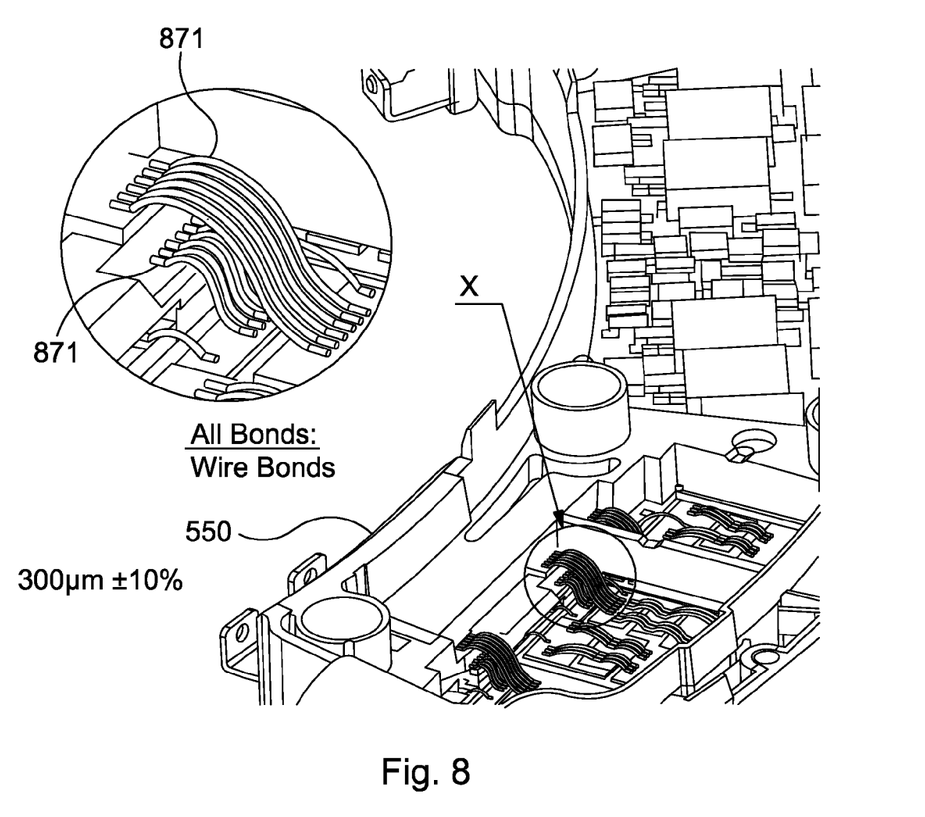
FIG. 8 illustrate the electrical coupling of an inverter leg according to an embodiment of the present invention.

In a preferred embodiment, wire bonds 871, 872 are used to electrically couple the first conductive region and the third conductive region to a respective power source busbar with the wire bonds 871, 872 from the first conductive region and the second conductive region arranged to substantially overlap, as illustrated in FIG. 8. The other end of the respective power source busbars are coupled to the DC power source, where preferably the length of the respective power source busbars is kept to a minimum length, thereby keeping the DC power source and DC link capacitor in close proximity to the ends of the respective inverter legs.

The end of the respective phase winding busbars not coupled directly to the inverter legs are coupled to the respective coil set phase windings, where preferably the length of the respective phase winding busbars is kept to a minimum length, thereby keeping the coil set phase windings in close proximity to the center of the respective inverter legs.

Figure 9A:
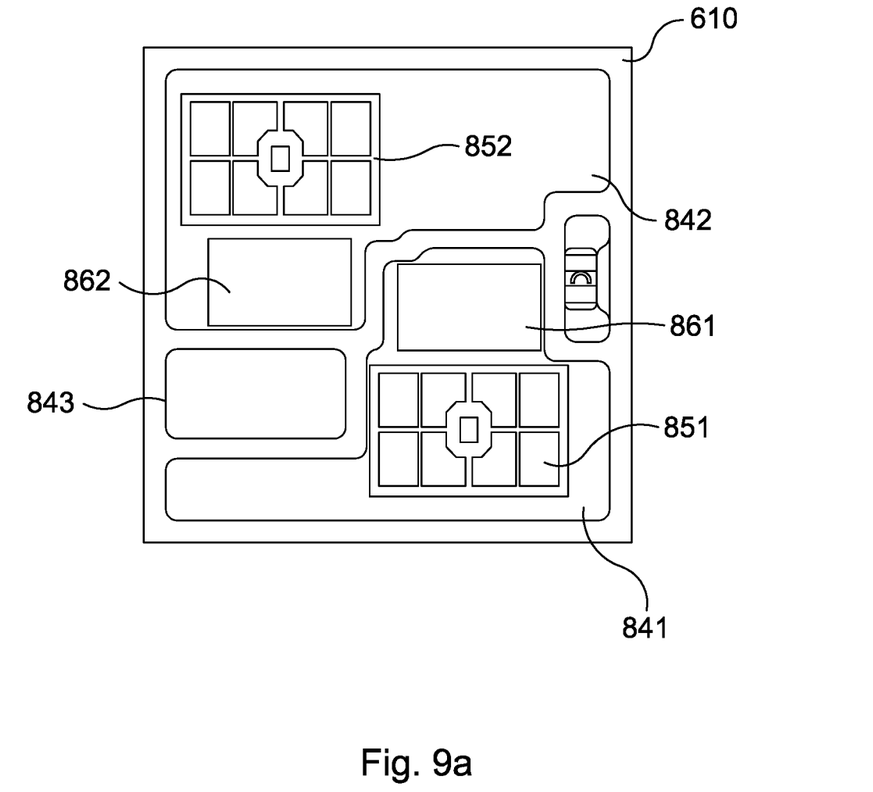
FIG. 9 illustrates the dimensions of an inverter leg according to an embodiment of the present invention.
Figure 9B:
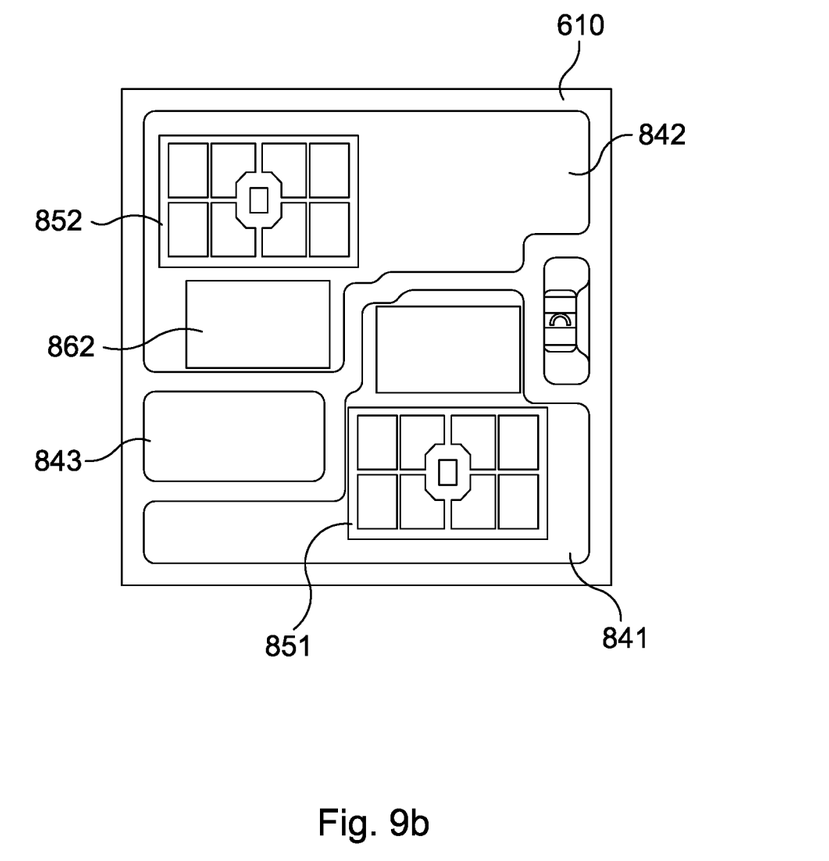

FIG. 9 illustrates the approximate dimensions for the components of an inverter leg, where FIG. 9a illustrates the approximate dimensions in mm for the conductive regions 841, 842, 843 formed on the insulation element 610 and FIG. 9b illustrates the approximate dimensions in mm for the semiconductor switches 851, 852 and diodes 861, 862 formed on the conductive regions 841, 842. Accordingly, by having both ends of an inverter leg and the respective inverter switches located adjacent to each other the current loop area can be kept low.

Preferably the dimensions and orientation of the inverter leg components provide for an internal inductance that is less than 10 nH.

The invention claimed is:

1. An inverter leg for an inverter of an electric motor or generator, the inverter leg comprising a first device and a second device mounted on a substrate, wherein the first device includes a first switch, a first contact arranged to be coupled to a first terminal of a power source, and a second contact, wherein in a first mode of operation the first switch is arranged to electrically couple the first contact to the second contact and in a second mode of operation the first switch is arranged to electrically isolate the first contact from the second contact; the second device includes a second switch, a third contact arranged to be coupled to a second terminal of a power source, and a fourth contact, wherein in a first mode of operation the second switch is arranged to electrically couple the third contact to the fourth contact and in a second mode of operation the second switch is arranged to electrically isolate the third contact from the fourth contact, wherein the first device and the second device are mounted on the substrate such that a portion of the first contact of the first device that is arranged to be coupled to the first terminal of a power source and a portion of the third contact of the second device that is arranged to be coupled to second terminal of a power source are located adjacent to each other on a first region of the substrate and the second contact of the first device and the fourth contact of the second device are arranged to be coupled to a coil winding of the electric motor or generator, wherein the first device further comprises a first diode and the second device further comprises a second diode, wherein a first side of the first switch and the first diode is mounted on the first contact and the second contact is mounted on a second side of the first switch and first diode.

2. An inverter leg according to claim 1, wherein a first side of the second switch and second diode is mounted on the fourth contact and the third contact is mounted on a second side of the second switch and second diode.

3. An inverter leg according to claim 1, wherein the first diode is connected in anti-parallel to the first switch and the second diode is connected in anti-parallel to the second switch.

4. An inverter leg according to claim 1, wherein the second contact is arranged to extend from the first switch in a first orientation away from the first terminal and second terminal of the power source.

5. An inverter leg according to claim 1, wherein the third contact is arranged to extend from the second switch in a second orientation toward the first terminal and second terminal of the power source.

6. An inverter leg according to claim 1, wherein the longitudinal axis of the second contact and longitudinal axis of the third contact are arranged to be substantially parallel with respect to each other.

7. An inverter leg according to claim 1, wherein the second contact of the first device and the fourth contact of the second device are arranged to be coupled to a coil winding of the electric motor or generator on an opposite side of the substrate with respect to the coupling of the first contact of the first device to the first terminal of a power source and the third contact of the second device to the second terminal of a power source.

8. A multi phase inverter for an electric motor or generator, the multi phase inverter comprising a plurality of inverter legs according to claim 1.

9. An electric motor comprising a stator having two coil sets arranged to produce a magnetic field of the motor, each coil set comprising a plurality of coil sub-sets; and a control device, wherein the control device includes a plurality of multiphase inverters according to claim 8, wherein the second contact of the first device and the fourth contact of the second device of the plurality of multiphase inverters are arranged to be coupled to the respective plurality of coil sub-sets for the first coil set and the second contact of the first device and the fourth contact of the second device of the plurality of multiphase inventers are arranged to be coupled to the respective plurality of coil sub-sets for the second coil set and the plurality of inverters are arranged to control current in the respective plurality of coil sub-sets to generate a magnetic field in each coil sub-set to have a substantially different magnetic phase to the other one or more coil sub-sets in the respective coil set; and wherein the first control device and the second control device are mounted adjacent to the stator.

10. A power module for an electric motor or generator, the power module comprising a multiphase inverter according to claim 8 and the first terminal of the power source and the second terminal of the power source, wherein the first terminal of the power source is mounted on a first side of the substrate for each inverter leg and the second terminal of the power source is mounted on the first side of the substrate for each inverter leg.

11. A power module according to claim 10, wherein the first terminal of the power source is located in a first plane above the plane of the substrate and the second terminal of the power source is located in a second plane above the plane of the substrate, wherein the first plane and second plane are separated relative to each other.

12. A power module according to claim 11, wherein the first terminal of the power source and the second terminal of the power source are arranged to be substantially co-planar.

13. A power module according to claim 10, wherein the first contact of each inverter leg is arranged to be coupled to the first terminal of the power source via a first wire bond and the third contact of each inverter leg is arranged to be couple to the second terminal of the power source via a second wire bond.

14. A power module according to claim 13, wherein the first wire bond and the second wire bond substantially overlap when coupled to the first terminal of the power source and the second terminal of the power source respectively.

15. A power module according to claim 10, wherein the distance of the closest point of the second device for each of the plurality of inverter legs to the first terminal of the power source is less than the furthest distance of the second device for each of the plurality of inverter legs to the first terminal of the power source.

16. A power module for according to claim 10, further comprising two multi phase inverters according to claim 10 and a driver for conditioning control signals for controlling the operation of the inverter switches, wherein the driver is located between the two multi phase inverters.

* * * * *